United States Patent
Tsao

(10) Patent No.: US 6,991,974 B2
(45) Date of Patent: Jan. 31, 2006

(54) METHOD FOR FABRICATING A LOW TEMPERATURE POLYSILICON THIN FILM TRANSISTOR

(75) Inventor: Yi-Chang Tsao, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 203 days.

(21) Appl. No.: 10/754,809

(22) Filed: Jan. 9, 2004

(65) Prior Publication Data
US 2005/0019996 A1 Jan. 27, 2005

(30) Foreign Application Priority Data
Jul. 24, 2003 (TW) .............................. 92120291 A

(51) Int. Cl.
H01L 21/00 (2006.01)
H01L 21/84 (2006.01)

(52) U.S. Cl. .................. 438/151; 438/163; 438/161; 438/164; 438/166

(58) Field of Classification Search .................. None
See application file for complete search history.

(56) References Cited

U.S. PATENT DOCUMENTS

| 6,818,967 B2 * | 11/2004 | Chen | 257/638 |
| 6,936,505 B2 * | 8/2005 | Keys et al. | 438/166 |
| 2002/0090767 A1 * | 7/2002 | Bullock et al. | 438/151 |
| 2003/0013278 A1 * | 1/2003 | Jang et al. | 438/466 |
| 2004/0188685 A1 * | 9/2004 | Lin et al. | 257/66 |

* cited by examiner

Primary Examiner—David Graybill
(74) Attorney, Agent, or Firm—Thomas, Kayden, Horstemeyer & Risley

(57) ABSTRACT

A method for fabricating a low temperature polysilicon thin film transistor. The method includes steps of: first, a substrate is provided and a buffer layer is then formed over the substrate. Next, a low surface energy material layer is formed over the buffer layer and then a first amorphous silicon layer is formed on the low surface energy material layer, or on a buffer layer processed by hydrogen plasma. The first amorphous silicon layer is completely melted by a laser annealing step so that the liquid first amorphous silicon layer sequentially transforms into a number of polysilicon seeds being uniformly distributed on the low surface energy material layer. A second amorphous silicon layer is further formed over the low surface energy material layer and covers the polysilicon seeds. The laser annealing step s The second amorphous silicon layer is completely melted after the laser annealing step so that the liquid second amorphous silicon layer sequentially transforms into a polysilicon layer with the associated polysilicon seeds during crystallization.

18 Claims, 13 Drawing Sheets

METHOD FOR FABRICATING A LOW TEMPERATURE POLYSILICON THIN FILM TRANSISTOR

This application claims the benefit of Taiwan application Serial No. 92120291, filed Jul. 24, 2003.

BACKGROUND OF THE INVENTION

1. Field of the Invention

The invention relates in general to a method for fabricating a thin film transistor (TFT), and more particularly to a method for fabricating a low temperature polysilicon (LTPS) thin film transistor.

2. Description of the Related Art

Recently, because of rapid development in technology, display panels have been generally applied in the portable appliances such as laptops, personal digital assistants (PDAs), and cellular phones. The display panel includes an amorphous silicon (a-Si) thin film transistor (TFT) display panel and a low temperature polysilicon (LTPS) TFT display panel. The LTPS TFT display panel is superior to the amorphous silicon TFT display panel due to the amorphous silicon layer of the LTPS TFT display panel is transformed into a polysilicon layer by laser annealing so that the TFT electron mobility can be improved efficiently. Therefore, the characteristic of higher electron mobility enables the LTPS to integrate driving circuit and integrated circuit (IC) in the TFT display panel and facilitates the flexibility of design in the display panel and the circuits without additional external circuit. As a result, the LTPS TFT display panel is going to be a star in the future.

FIGS. 1A to 1I are cross-section views showing a conventional process for fabricating a low temperature polysilicon thin-film transistor. First, referring to FIG. 1A, a glass substrate 11 is provided and then a silicon dioxide ($SiO_2$) layer 12 is formed over the glass substrate 11. An amorphous silicon layer 13 is formed over the $SiO_2$ layer 12 subsequently. Besides, the thickness of the amorphous silicon layer 13 is preferably about 500 angstrom (Å).

The laser-annealing step is used to transform the amorphous silicon layer 13 into a polysilicon layer 14, which is shown as FIG. 1B. The next step is to remove portions of the polysilicon layer 14 to form at least one polysilicon island 14a on the $SiO_2$ layer 12 as shown in FIG. 1C.

Next, both ends of the polysilicon island 14a are doped to respectively form a heavily doped n type (n+) ohmic contact layer 15 and a residual polysilicon layer 14b. Each of the n+ ohmic contact layers 15 is closely connected to the lateral residual polysilicon island 14b at both ends as shown in FIG. 1D. A first insulating layer 16 is then formed over the $SiO_2$ layer 12 to cover the n+ ohmic contact layers 15 as well as the residual polysilicon island 14b.

Both ends of the residual polysilicon island 14b are doped where to respectively form a lightly doped n type (n−) ohmic contact layer 17. Meanwhile, a polysilicon channel area 14c is also formed; thus, each of the n− ohmic contact layers 17 is in the position between the polysilicon channel area 14c and the n+ ohmic contact layer 15 as shown in FIG. 1E. Agate 18, which is disposed at a location opposite to the polysilicon channel area 14c, is then formed on the first insulating layer 16. Each of the n− ohmic contact layers 17 also functions as a lightly doped drain (LDD) herein.

Next, a second insulating layer 19 is formed on the first insulating layer 16 to cover the gate 18 as shown in FIG. 1F. There are a first contact hole 20a and a second contact hole 20b penetrating through the second insulating layer 19 as well as the first insulating layer 16, respectively. Besides, the first contact hole 20a and the second contact hole 20b are selectively located near the lateral ends of the gate 18 so that portions of the n+ ohmic contact layers 17 are exposed.

FIG. 1G illustrates the next step that a source 21a and a drain 21b are respectively formed within the first contact hole 20a and the second contact hole 20b and cover portions of the second insulating layer 19 near both ends of the gate 18. The source 21a and the drain 21b are electricity connected to the n+ ohmic contact layers 17 via the first contact hole 20a as well as the second contact hole 20b, respectively.

Referring to FIG. 1H, a passivation layer 22 is formed over the second insulating layer 19 to cover the source 21a and the drain 21b. In addition, there is a third contact hole 23 penetrating through the passivation layer 22 so that a portion of the source 21a is explored. An indium tin oxide (ITO) electrode 24 is then formed within the third contact hole 23 and on a portion of the passivation 22; therefore, the source 21a electrically connects to the ITO electron 24 via the third contact hole 23. The cross-section view of the finished LTPS-TFT 10 is shown in FIG. 1I.

FIG. 1J illustrates the condition when the amorphous layer 13 is partially melted by laser annealing into a solid amorphous silicon layer 13a and a liquid amorphous silicon layer 13b. Typically, the phenomenon of heterogeneous nucleation occurs at the solid a-Si layer 13a/liquid a-Si layer 13b interface. Therefore, a number of polysilicon seeds 14d are formed and irregularly distributed on the rough surface of the solid amorphous silicon layer 13a. The irregularly distributed polysilicon seeds 14d consequently serve as nucleation sites during the crystallization process The amorphous silicon layer 13b crystallizes heterogeneously, which results in forming of substantially distinct polysilicon grain sizes due to the irregularly distributed nucleation sites. As a result, the electron mobility of TFT can not be improved effectively.

FIG. 1K illustrates the condition when the amorphous layer 13 is completely melted into a liquid amorphous layer 13c. From the perspective of thermodynamic, free energy of the solid amorphous layer 13 is smaller than that of liquid amorphous layer 13c. The liquid amorphous layer 13c is therefore in a so-called super-cooling condition. Thus, homogeneous nucleation occurs within the liquid amorphous silicon layer 13c. The polysilicon seeds 14e with almost identical grains size are formed gradually with even distribution. The amorphous silicon 13c is then homogeneously crystallized as the polysilicon layer. Even though the uniformality of the grain size is greatly improved, the grain size is generally small, which does not benefit the electron mobility of TFT.

In the light of practical experiences, the best solution for overcoming the problems mentioned above is to identify a super lateral growth (SLG), which is the best depth of liquid amorphous silicon layer. Referring back to FIG. 1J, when the depth of liquid amorphous silicon layer 13b is equal to the super lateral growth. The distances between polysilicon seeds 14d would be adequate to form large grains. Besides, the polysilicon seeds 14d can also be evenly distributed at the solid a-Si layer/liquid a-Si layer interface during the step of laser annealing; however, it is very difficult to achieve the goal. Hence, it is desirable to develop a technique to convert the amorphous silicon layer into the polysilicon layer over which large grains are distributed uniformly.

SUMMARY OF THE INVENTION

It is therefore an object of the invention to provide a method for fabricating a low temperature polysilicon thin film transistor (LTPS-TFT). The features of the method are described as follows: The first amorphous silicon layer, which is either on a low surface energy material layer or on a buffer layer processed by hydrogen plasma, can be transformed to uniformly distributed polysilicon seeds by the laser annealing step according to either the method of forming a low surface energy material layer on the buffer layer or the method of processing the surface of the buffer layer by hydrogen plasma. Therefore, a polysilicon layer with larger grain size and better uniformity of grain distribution can be formed from the polysilicon seeds covered by the second polysilicon layer by laser annealing. As a result, the electron mobility of the LTPS-TFT increases efficiently.

The invention achieves the above-identified objects by providing a new method for fabricating a low temperature polysilicon thin film transistor. Firstly, a buffer layer is formed over a substrate. Secondly, a low surface energy material layer is formed over the buffer layer, and then a first amorphous silicon layer is formed over the low surface energy material layer. Next, the first amorphous silicon layer is completely melted by a laser annealing step to transform the liquid first amorphous silicon layer into a number of polysilicon seeds uniformly distributed on the low surface energy material layer. Afterwards a second amorphous silicon layer is formed over the low surface energy material layer and covers the polysilicon seeds. Finally, the laser annealing step is used again to completely melt the second amorphous silicon layer so as to crystallize the liquid second amorphous silicon layer into a polysilicon layer with the associated polysilicon seeds.

It is another object of the invention to provide a method for fabricating a low temperature polysilicon thin film transistor. Firstly, a substrate is provided and then a buffer layer is formed over the substrate. Secondly, a plasma hydrogenation step is used to process the surface of the buffer layer, and then a first amorphous silicon layer is formed over the buffer layer. Next, the first amorphous silicon layer is completely melted by a laser annealing step to transform the liquid first amorphous silicon layer into a number of polysilicon seeds uniformly distributed on the buffer layer. Afterwards a second amorphous silicon layer is formed over the buffer layer and covers the polysilicon seeds. Finally, the laser annealing step is used again to completely melt the second amorphous silicon layer to crystallize the liquid second amorphous silicon layer into a polysilicon layer with the associated polysilicon seeds.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1A:
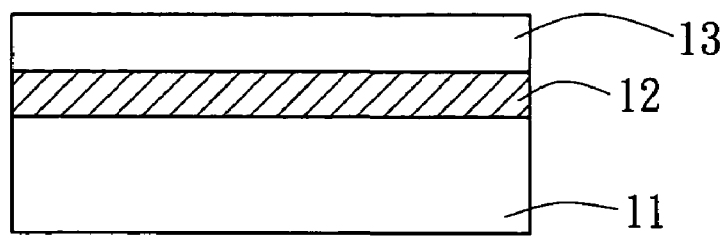
FIG. 1A to 1I (Prior Art) are cross-sectional views showing a conventional process for fabricating a low temperature polysilicon thin film transistor.
Figure 1B:
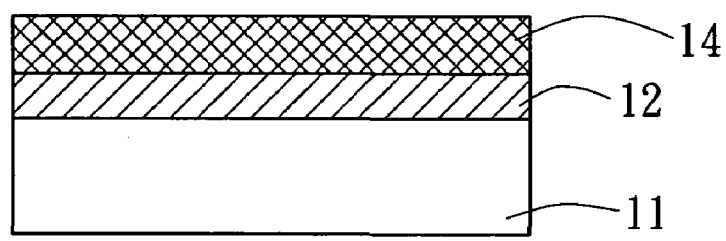
Figure 1C:
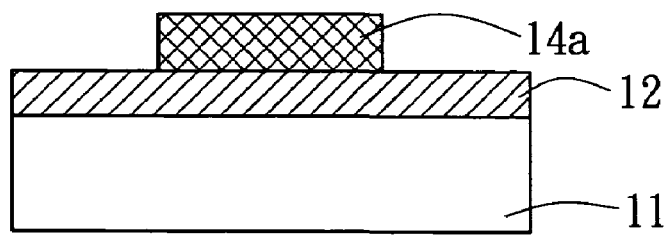
Figure 1D:
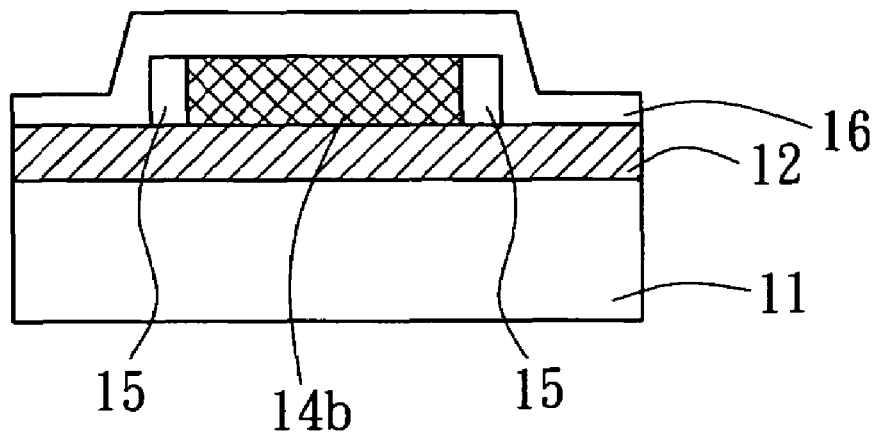
Figure 1E:
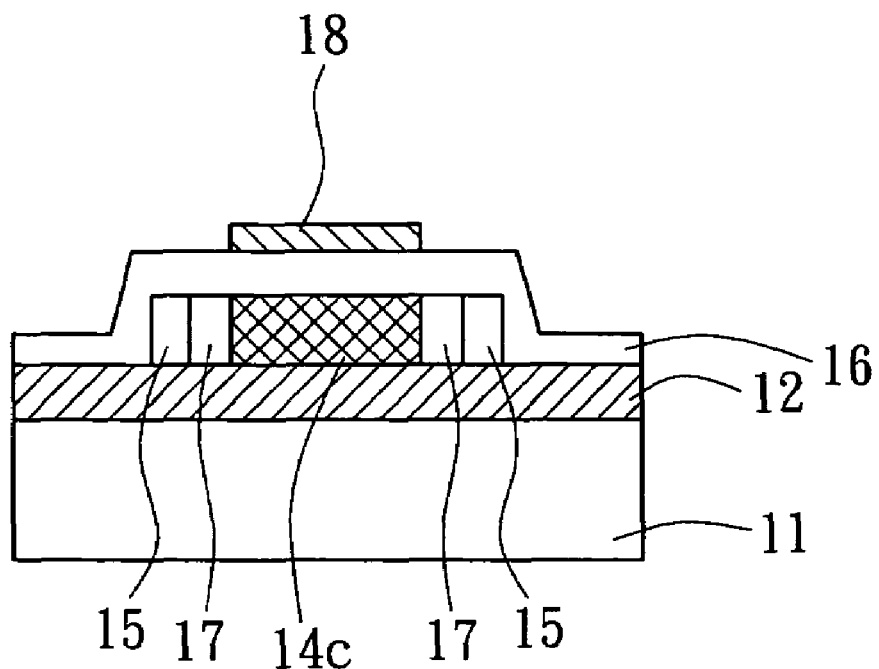
Figure 1F:
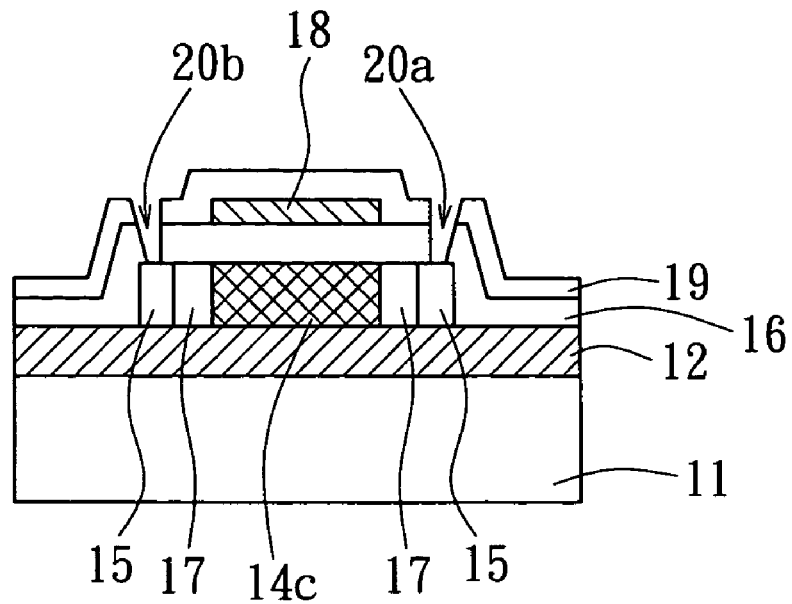
Figure 1G:
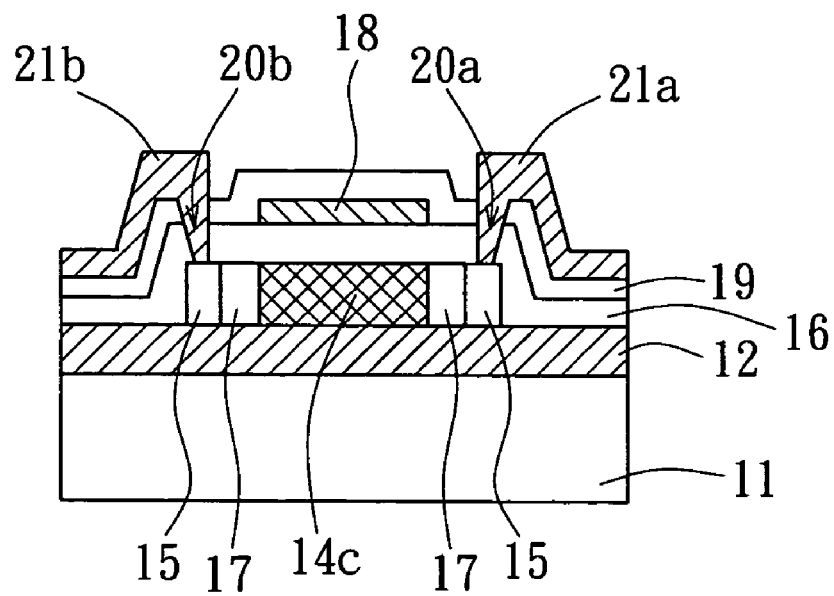
Figure 1H:
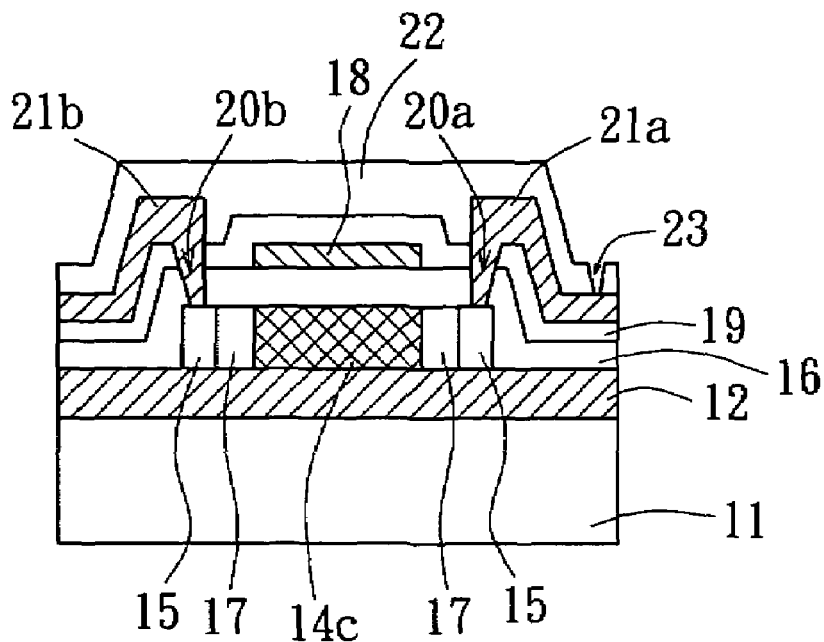
Figure 1I:
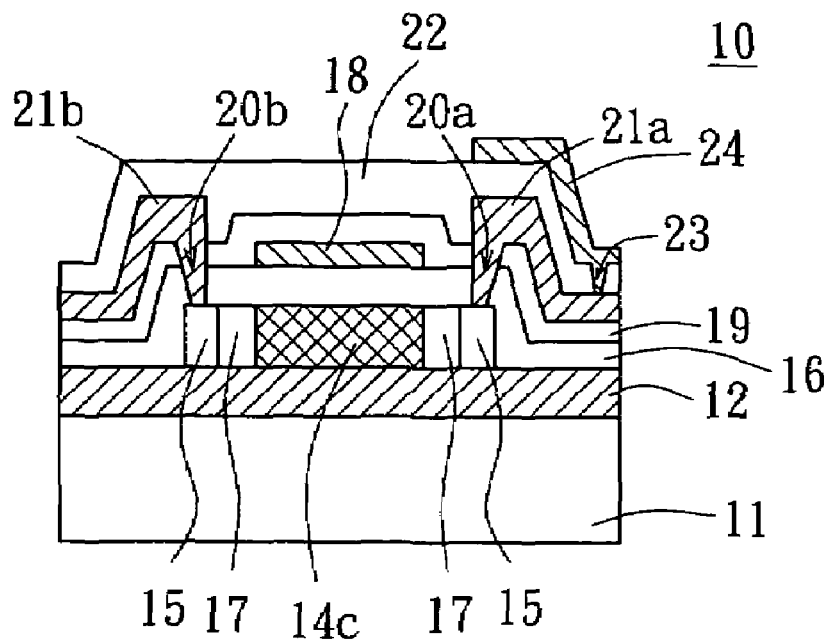
Figure 1J:
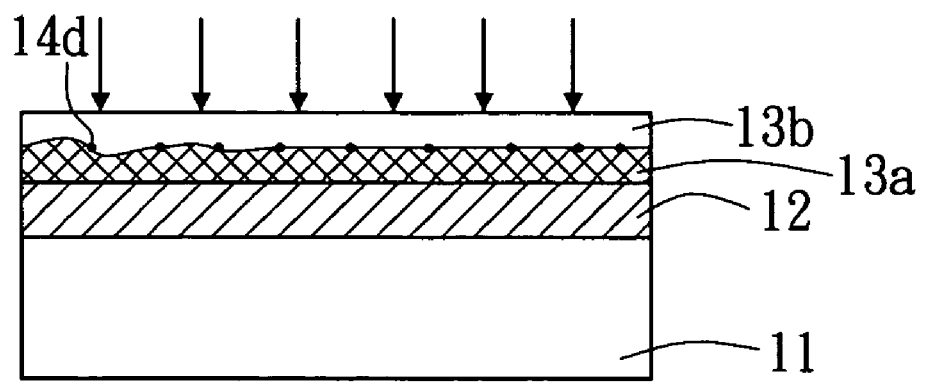
FIG. 1J (Prior Art) is a cross-sectional view of the amorphous layer shown in FIG. 1A showing the half-melted amorphous layer.
Figure 1K:
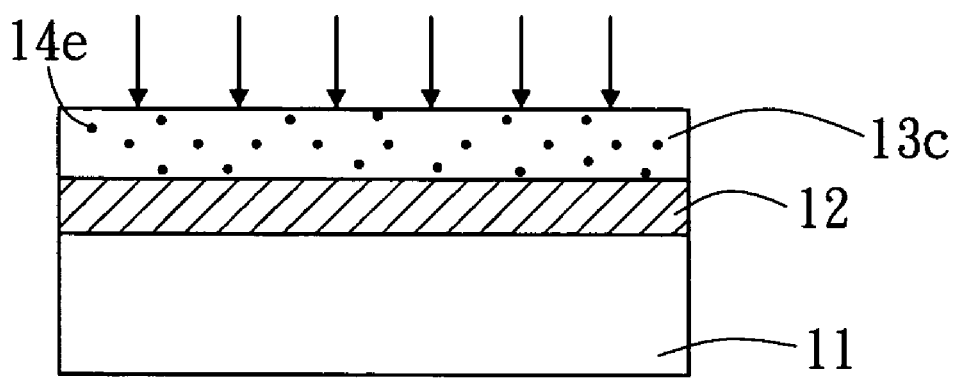
FIG. 1K (Prior Art) is a cross-sectional view of the amorphous layer shown in FIG. 1A showing the completely melted amorphous layer.
Figure 2:
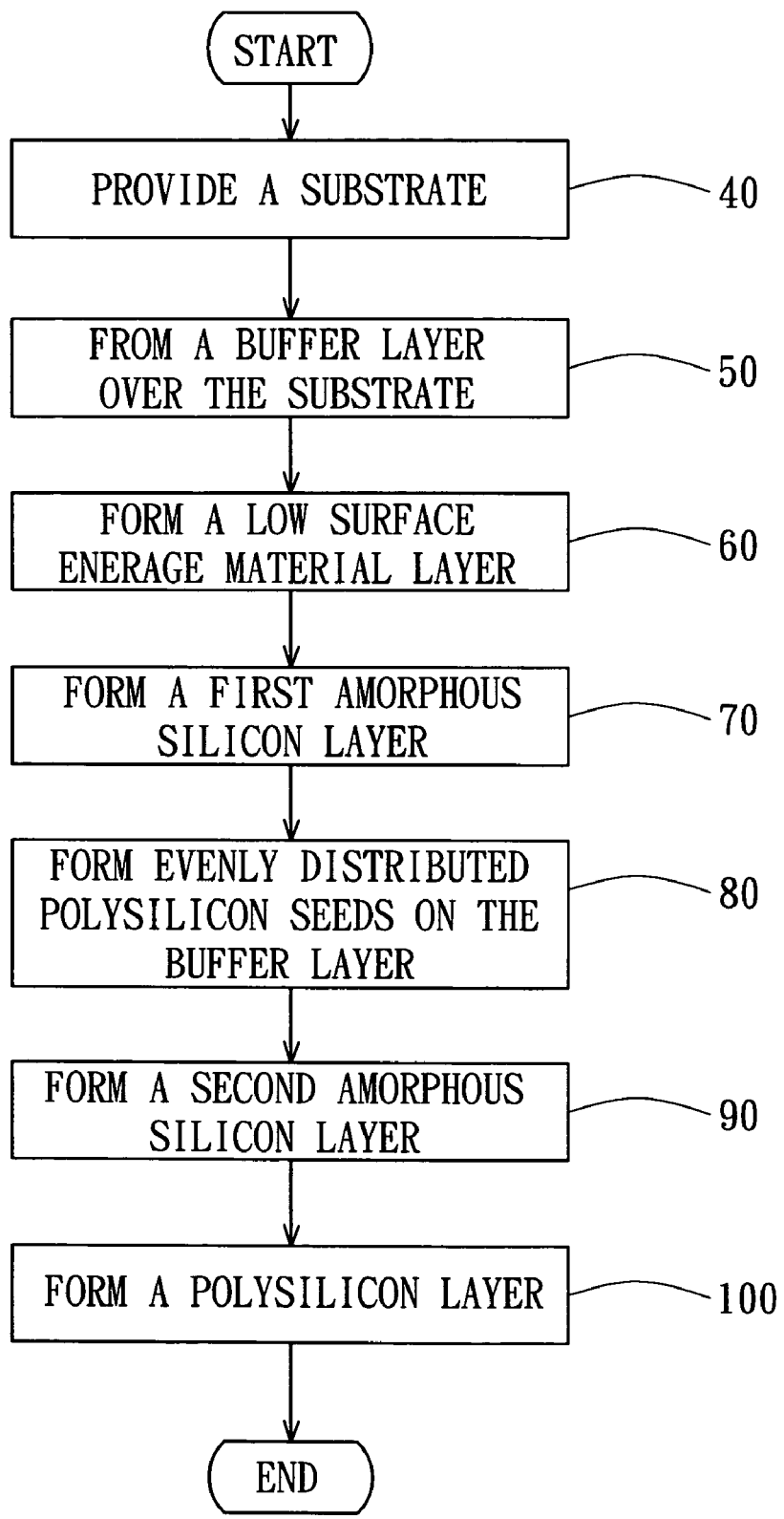
FIG. 2 shows portions of the sequential process for fabricating a low temperature polysilicon thin film transistor in accordance with the first embodiment of the present invention.

FIG. 2 shows portions of the sequential process for fabricating a low temperature polysilicon thin film transistor in accordance with the first embodiment of the present invention. FIG. 3A to FIG. 3K are cross-sectional views showing a process of fabricating low temperature polysilicon thin film transistor in accordance with the first embodiment of the present invention.

Figure 3A:
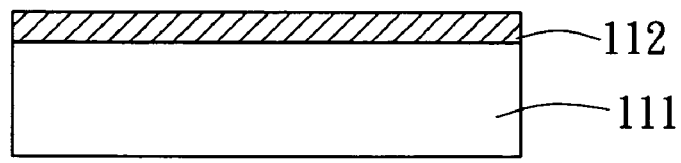
FIG. 3A to 3K are cross-sectional views showing a process of fabricating low temperature polysilicon thin film transistor in accordance with the first embodiment of the present invention.
Figure 3B:
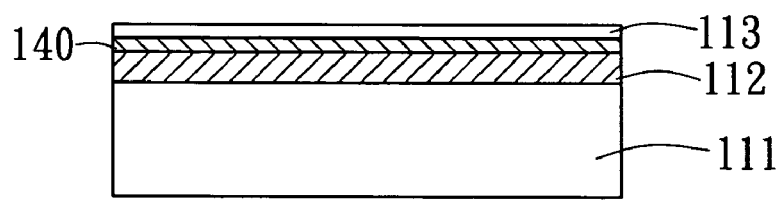

Firstly, a substrate 111, such as a glass substrate or a plastic substrate, is provided in the step 40. A buffer layer 112, such as a silicon dioxide layer ($SiO_2$), is then formed over the substrate 111 in step 50 as shown in FIG. 3A. In step 60, a low surface energy material layer 140 is formed over the buffer layer 112. In step 70, a first amorphous silicon (a-Si) layer 113 with about 50 angstrom (Å) in thickness is formed over the low surface energy material layer 140 as shown in FIG. 3B.

Figure 3C:
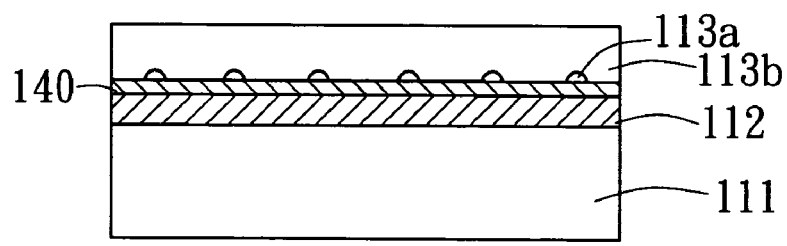
Figure 3D:
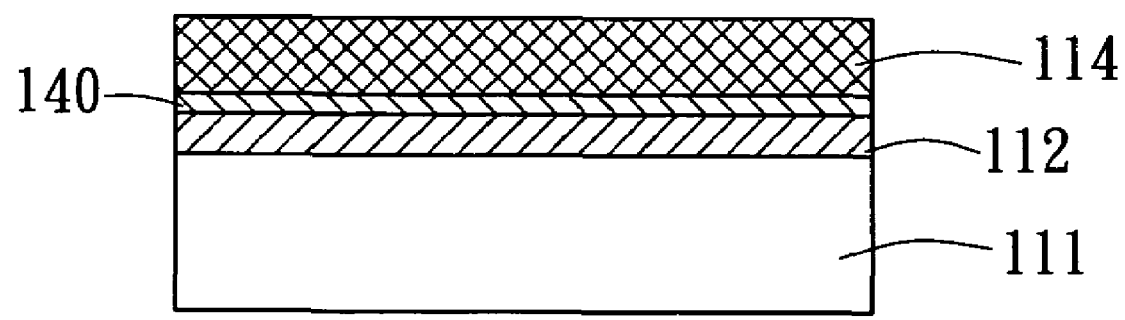

In step 80, a laser annealing step is used to completely melt the first amorphous silicon layer 113 and then a liquid first amorphous silicon layer is formed consequently. The liquid first amorphous silicon layer 113 will auto-shrink due to its low surface energy and then transforms into a number of desk-like polysilicon seeds (drops) 113a uniformly distributed on the low surface energy material layer. In step 90, a second amorphous silicon layer 113b is formed over the low surface energy material layer 140 and all of the polysilicon seeds 113a are covered as a result as shown in FIG. 3C. The second amorphous silicon layer 113b is about 450 Å in thickness and therefore is thicker than the first amorphous silicon layer 113a, which is about 50 Å in thickness. In the step 100, the laser annealing step is used again to completely melt the second amorphous silicon layer 113b so that the liquid second amorphous silicon layer 113b begins to rearrange its inner structure and crystallizes itself into a polysilicon layer 114 with the associated polysilicon seeds 113a as shown in FIG. 3D.

It is noteworthy that the grain sizes of polysilicon layer 114 according to the invention are greater than the same of conventional grain sizes of polysilicon layer because of the preformation of polysilicon seeds 113a in step 80. The grain sizes of polysilicon layer 114 can even approach 1 micrometer ($\mu$m). Besides, the grains of the polysilicon layer 114 according to the invention are more evenly distributed than the same of polysilicon layer according to the conventional LTPS-TFT fabricating process.

Figure 3E:
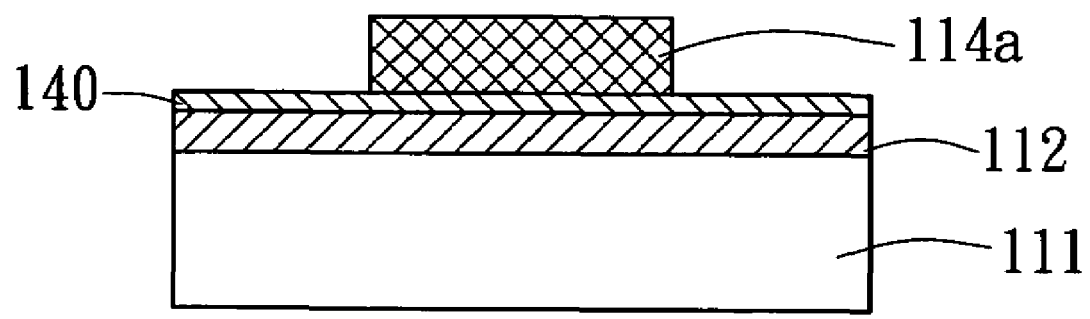
Figure 3F:
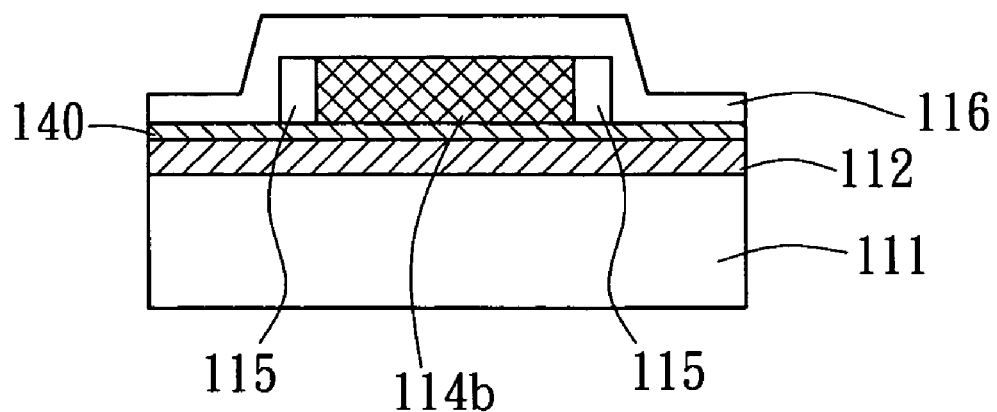

After the process of forming the polysilicon layer 114 is finished, portions of the polysilicon layer 114 are then removed to form a polysilicon island 114a on the low surface energy material layer 140 as shown in FIG. 3E. The following step is to dope both ends of the polysilicon island 114a so that a heavily doped n+ ohmic contact layer 115 is formed in each end of the polysilicon island 114a. Meanwhile, a residual polysilicon island 114b is also formed adjacent to each of the heavily doped n+ ohmic contact layer 115. Next, a first insulating layer 116 is formed over the low surface energy material layer 140, the n+ ohmic contact layer 115, and the residual polysilicon island 114b as shown in FIG. 3F.

Figure 3G:
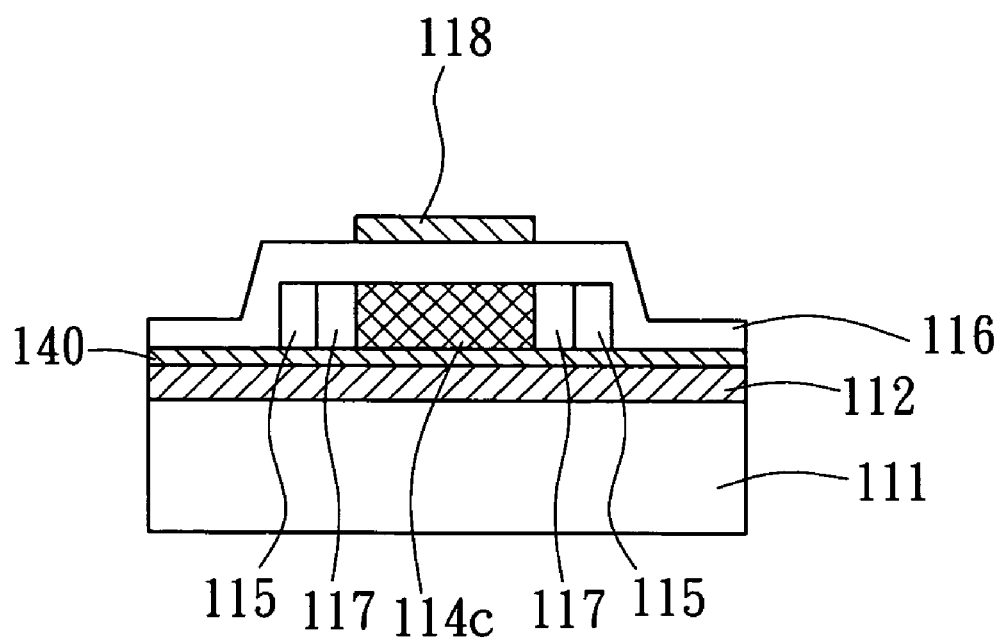

Referring to FIG. 3G, while both ends of the residual polysilicon island 114b are doped to form a lightly doped n– ohmic contact layer 117 respectively, a polysilicon channel area 114c contiguous to these n– ohmic contact layers 117 is also formed. That is, each of the n– ohmic contact layers 117 locates between the polysilicon channel area 114c and the n+ ohmic contact layer 115, wherein the n– ohmic contact layer 117 is also called lightly doped drain, LDD. The sequent process is to form a gate 118 on the first insulating layer 116 right over the polysilicon channel area 114c.

Figure 3H:
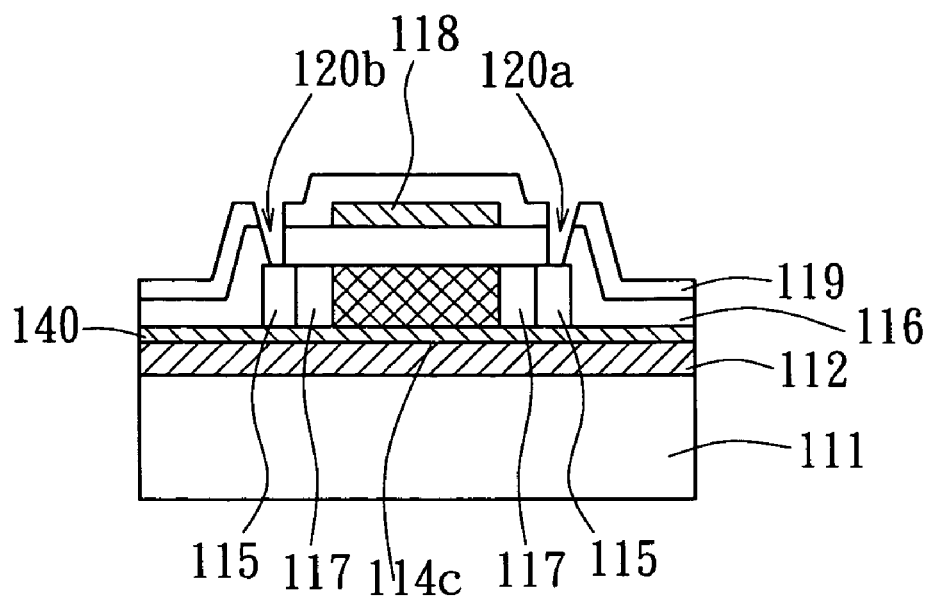

Referring to FIG. 3H, a second insulating layer 119 is formed on the first insulating layer 116 to cover the gate 118. A first contact hole 120a and a second contact hole 120b are formed in the space, penetrating through the second insulating layer 119 and the first insulating layer 116 near the lateral ends of gate 118. Thus, portions of the upper surface of the n+ ohmic contact layers are exposed.

Figure 3I:
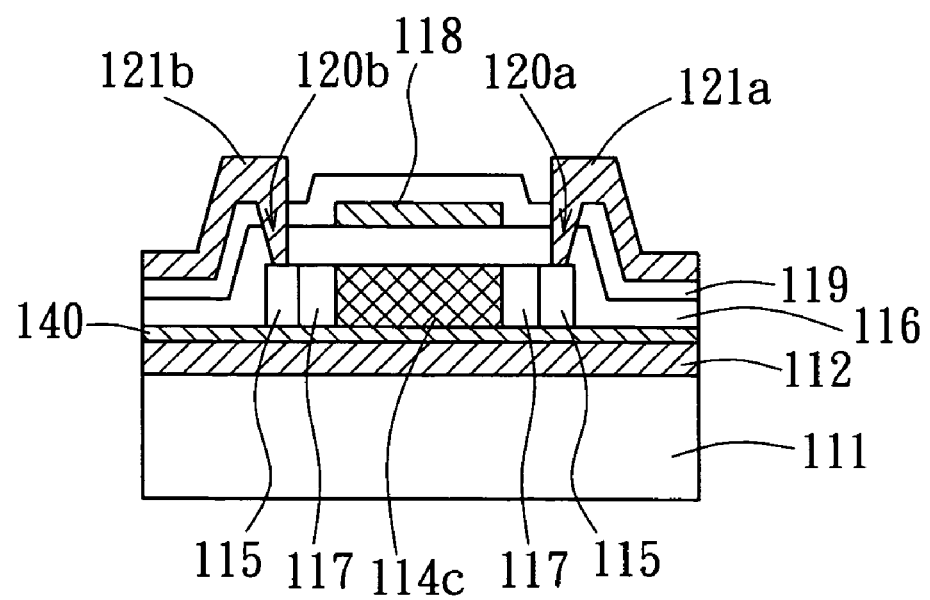

The next step is to form a source 121a and a drain 121b configured within the first contact hole and the second contact hole respectively and on the portions of the second insulating layer 119. Both of the source 121a and the drain 121b electrically connect with the exposed n+ ohmic contact layers 117 via the first contact hole 120a and the second contact hole 120b, respectively as shown in FIG. 3I.

Figure 3J:
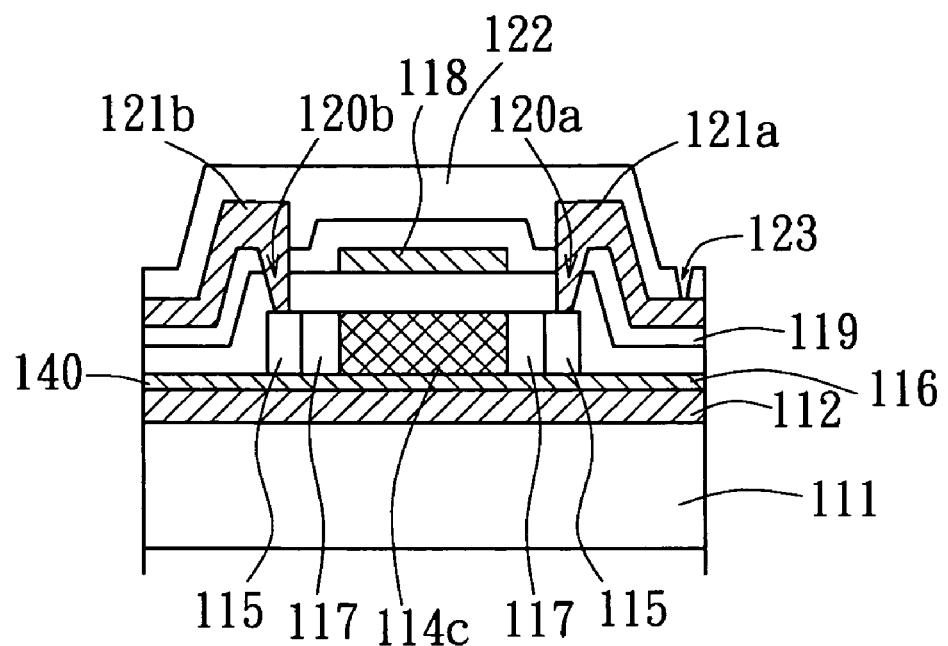

A passivation layer 122 is subsequently formed on the second insulating layer 119, the source 121a, and the drain 121b. The passivation layer 122 also comprises a third contact hole 123 exposing portions of the source 121a or the drain 121b as shown in FIG. 3J.

Figure 3K:
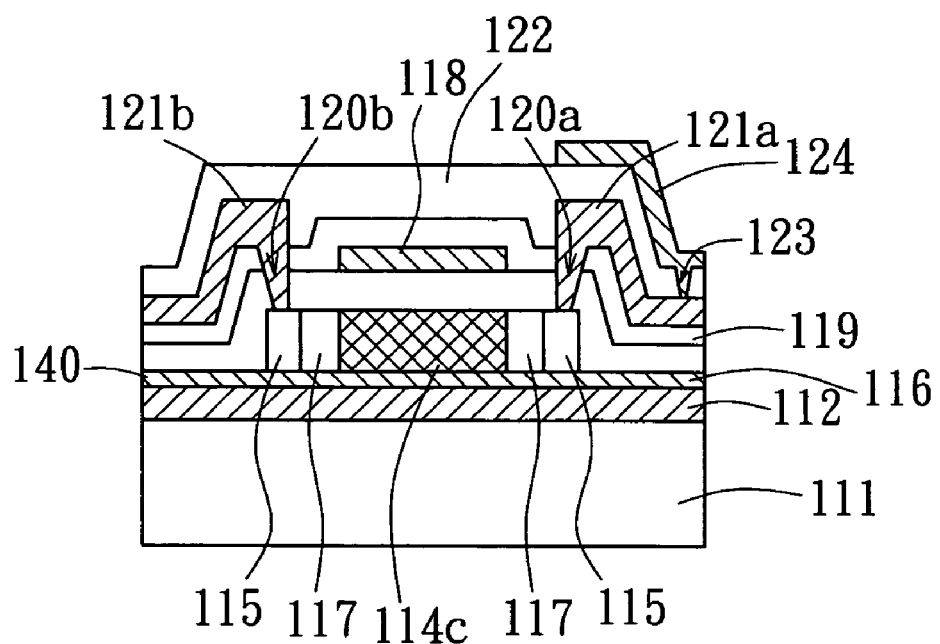

Referring to FIG. 3K, an indium tin oxide (ITO) electrode 124 is formed on the passivation 122 and electrically connected with the source 121a or the drain 121b via the third contact hole 123.

The electron mobility of the LTPS-TFT 110 can increase significantly according to the invention owing to the greater grain size and better uniformity of the grain distribution of the polysilicon layer 114 compared to the same of conventional LTPS-TFT 10.

Figure 4A:
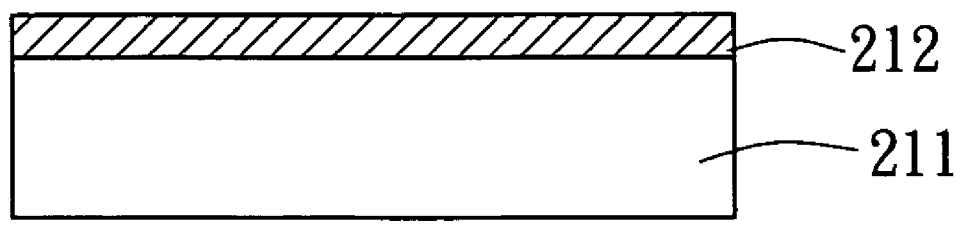
FIG. 4A to 4D are cross-sectional views showing portions of fabricating process of a low temperature polysilicon thin film transistor in accordance with the second embodiment of the present invention.

FIG. 4A to FIG. 4D are cross-sectional views showing portions of fabricating process of low temperature polysilicon thin film transistor in accordance with the second embodiment of the present invention. Referring to FIG. 4A, a buffer layer 212, such as a silicon dioxide, is first formed over a substrate 211. The substrate 211 can be a glass substrate or a plastic substrate.

Figure 4B:
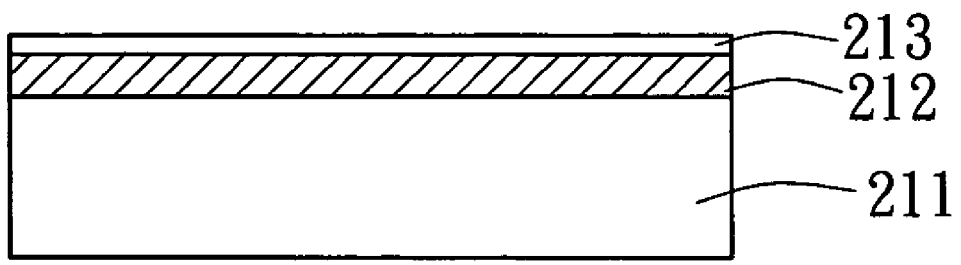

Referring to FIG. 4B, a plasma hydrogenation step is used to process the surface of the buffer layer 212, and then a first amorphous silicon layer 213 is formed over the buffer layer 212. The thickness of the first amorphous silicon layer is about 50 Å. The function of the plasma hydrogenation step is to change the chemical bonding of the surface of buffer layer 212 from polarity to nonpolarity.

Figure 4C:
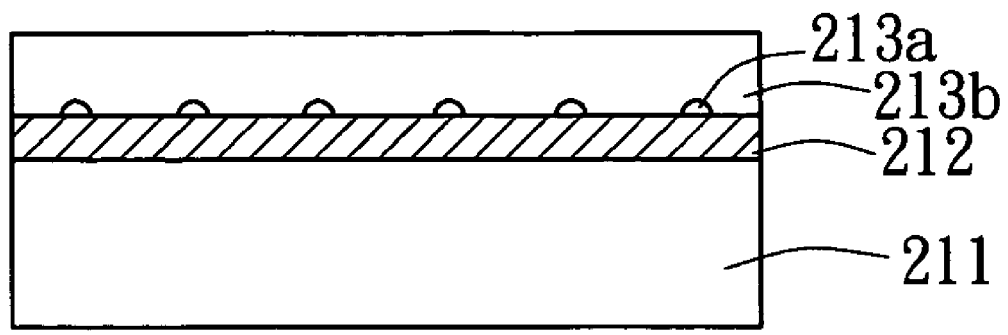

Referring to FIG. 4C, the first amorphous silicon layer 213 is completely melted by a laser annealing step so as to change the phase from solid to liquid. Laser annealing step transforms the liquid first amorphous silicon layer 213 into a number of polysilicon seeds 213a uniformly distributing on the surface of buffer layer 212. A second amorphous silicon layer 213b is sequentially formed over the buffer layer 212 and covers these polysilicon seeds 213a. The second amorphous silicon layer 213b is about 450 Å in thickness and therefore is thicker than the first amorphous silicon layer 113a.

Figure 4D:
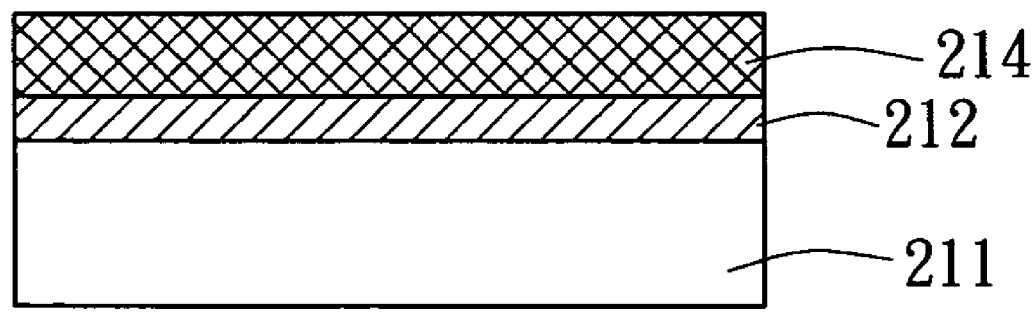

Referring to FIG. 4D, the laser annealing step is performed again to completely melt the second amorphous silicon layer 213b so that the liquid second amorphous silicon layer 213b begins to rearrange its inner structure and crystallizes into a polysilicon layer 214 with the associated polysilicon seeds 213a. The sequent process is the same as the first embodiment so that the description will not be repeated herein.

In conclusion, the electron mobility of the LTPS-TFT can be increased significantly according to the method provided by the invention disclosed above. It is because the larger grains size and better uniformity of the grains distribution of the polysilicon layer is produced.

While the invention has been described by way of two embodiments mentioned above, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a low temperature polysilicon thin film transistor, comprising the steps of:
   providing a substrate;
   forming a buffer layer over the substrate;
   forming a low surface energy material layer over the buffer layer;
   forming a first amorphous silicon layer over the low surface energy material layer;
   melting the first amorphous silicon layer by a laser annealing step to transform the liquid first amorphous silicon layer into a plurality of polysilicon seeds uniformly distributed on the low surface energy material layer;
   forming a second amorphous silicon layer over the low surface energy material layer and covering the polysilicon seeds; and
   melting the second amorphous silicon layer by the laser annealing step to crystallize the liquid second amorphous silicon layer into a polysilicon layer with the associated polysilicon seeds.

2. The method according to claim 1, wherein the thickness of the second amorphous silicon layer is larger than the thickness of the first amorphous silicon layer.

3. The method according to claim 2, wherein the thickness of the first amorphous silicon layer is preferably 50 angstrom (Å).

4. The method according to claim 3, wherein the thickness of the second amorphous silicon layer is preferably about 450 Å.

5. The method according to claim 1, wherein the substrate is a glass substrate.

6. The method according to claim 1, wherein the buffer layer is a silicon dioxide layer.

7. The method according to claim 1, wherein the method further comprises the steps of:
   eliminating portions of the polysilicon layer to form a polysilicon island;
   doping both ends of the polysilicon island where to respectively form a heavily doped n type (n+) ohmic contact layer, which is also respectively in contact with a residual polysilicon island;

forming a first insulating layer over the n+ ohmic contact layer, the residual polysilicon island, and portions of the low surface energy material layer;

doping both ends of the residual polysilicon island to form a lightly doped n type (n–) ohmic contact layer and a polysilicon channel area, wherein the n– ohmic contact layer is respectively located between the polysilicon channel area and the n+ ohmic contact layers;

forming a gate, which is disposed at a location opposite to the polysilicon channel area, on the first insulating layer;

forming a second insulating layer on the first insulating layer to cover the gate, wherein there are a first contact hole and a second contact hole penetrating through both of the second insulating layer and the first insulating layer, and the first contact hole as well as the second contact hole are selectively located near the lateral ends of the gate to expose the n+ ohmic contact layers;

forming a source and a drain within the first contact hole and the second contact hole respectively and on the portions of the second insulating layer, wherein the source and the drain are electrically connected to the n+ ohmic contact layers via the first contact hole and the second contact hole, respectively;

forming a passivation layer on the second insulating layer, the source, and the drain, wherein the passivation layer comprises a third contact hole for exposing portions of the source or the drain; and forming an indium tin oxide (ITO) electrode on the passivation and within the third contact hole, so that the ITO electrode is electrically connected to the source or the drain via the third contact hole.

8. A method for fabricating a low temperature polysilicon thin film transistor, comprising the steps of:
providing a substrate;
forming a buffer layer over the substrate;
processing the surface of the buffer layer by a plasma hydrogenation step;
forming a first amorphous silicon layer over the buffer layer;
melting the first amorphous silicon layer by a laser annealing step to transform the liquid first amorphous silicon layer into a plurality of polysilicon seeds uniformly distributed on the buffer layer;
forming a second amorphous silicon layer over the buffer layer and covering the polysilicon seeds; and
melting the second amorphous silicon layer by the laser annealing step to crystallize the liquid second amorphous silicon layer into a polysilicon layer with the associated polysilicon seeds.

9. The method according to claim 8, wherein the second amorphous silicon layer is thicker than the first amorphous silicon layer.

10. The method according to claim 9, wherein the thickness of the first amorphous silicon layer is preferably about 50 Å.

11. The method according to claim 10, wherein thickness of the second amorphous silicon layer is preferably about 450 Å.

12. The method according to claim 8, wherein the substrate is a glass substrate.

13. The method according to claim 8, wherein the buffer layer is a silicon dioxide layer.

14. The method according to claim 8, wherein the method further comprises the steps of:
eliminating portions of the polysilicon layer to form a polysilicon island;

doping both ends of the polysilicon island where to respectively form a heavily doped n type (n+) ohmic contact layer, which is also respectively in contact with a residual polysilicon island;

forming a first insulating layer over the n+ ohmic contact layer, the residual polysilicon island, and portions of the buffer layer;

doping both ends of the residual polysilicon island to form a lightly doped n type (n–) ohmic contact layer and a polysilicon channel area, wherein the n– ohmic contact layer is respectively located between the polysilicon channel area and the n+ ohmic contact layers;

forming a gate, which is disposed at a location opposite to the polysilicon channel area, on the first insulating layer;

forming a second insulating layer on the first insulating layer to cover the gate, wherein a first contact hole and a second contact hole penetrate through both of the second insulating layer and the first insulating layer, and selectively located near the lateral ends of the gate to expose the n+ ohmic contact layers;

forming a source and a drain disposed within the first contact hole and the second contact hole respectively and on the portions of the second insulating layer, wherein the source and the drain are electrically connected to the n+ ohmic contact layers via the first contact hole and the second contact hole, respectively;

forming a passivation layer on the second insulating layer, the source, and the drain, wherein the passivation layer comprises a third contact hole for exposing portions of the source or the drain; and forming an indium tin oxide (ITO) electrode on the passivation and within the third contact hole such that the ITO electrode is electrically connected to the source or the drain via the third contact hole.

15. A method for fabricating a low temperature polysilicon thin film transistor, comprising the steps of:
providing a substrate;
forming a silicon dioxide layer over the substrate;
forming a low surface energy material layer over the silicon dioxide layer;
forming a first amorphous silicon layer over the low surface energy material layer;
melting the first amorphous silicon layer by an laser annealing step to transform the liquid first amorphous silicon layer into a plurality of polysilicon seeds uniformly distributed on the low surface energy material layer;
forming a second amorphous silicon layer, which is thicker than the first amorphous silicon layer, over the low surface energy material layer and covering the polysilicon seeds; and
melting the second amorphous silicon layer by the laser annealing step to crystallize the liquid second amorphous silicon layer into a polysilicon layer with the associated polysilicon seeds.

16. The method according to claim 15, wherein the thickness of the first amorphous silicon layer is preferably about 50 Å.

17. The method according to claim 16, wherein thickness of the second amorphous silicon layer is preferably about 450 Å.

18. The method according to claim 15, wherein the method further comprises the steps of:
eliminating portions of the polysilicon layer to form a polysilicon island;

doping both ends of the polysilicon island where to respectively form a heavily doped n type (n+) ohmic contact layer, which is also respectively in contact with a residual polysilicon island;

forming a first insulating layer over the n+ ohmic contact layer, the residual polysilicon island, and portions of the low surface energy material layer;

doping both ends of the residual polysilicon island to form a lightly doped n type (n−) ohmic contact layer and a polysilicon channel area, wherein the n− ohmic contact layer is respectively located between the polysilicon channel area and the n+ ohmic contact layers;

forming a gate, which is disposed at a location opposite to the polysilicon channel area, on the first insulating layer;

forming a second insulating layer on the first insulating layer to cover the gate, wherein there are a first contact hole and a the second contact hole penetrating through both of the second insulating layer and the first insulating layer, and the first contact hole as well as the second contact hole are selectively located near the lateral ends of the gate to expose the n+ ohmic contact layers;

forming a source and a drain within the first contact hole and the second contact hole respectively and on the portions of the second insulating layer, wherein the source and the drain are electrically connected to the n+ ohmic contact layers via the first contact hole and the second contact hole, respectively;

forming a passivation layer on the second insulating layer, the source, and the drain, wherein the passivation layer comprises a third contact hole for exposing portions of the source or the drain; and forming an indium tin oxide (ITO) electrode on the passivation and within the third contact hole, so that the ITO electrode is electrically connected to the source or the drain via the third contact hole.

* * * * *